(12) United States Patent
Weihrauch

(10) Patent No.: US 11,183,408 B2
(45) Date of Patent: Nov. 23, 2021

(54) IN-LINE WET BENCH DEVICE AND METHOD FOR THE WET-CHEMICAL TREATMENT OF SEMICONDUCTOR WAFERS

(71) Applicant: HANWHA Q CELLS GMBH, Bitterfeld-Wolfen (DE)

(72) Inventor: Anika Weihrauch, Koethen (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 431 days.

(21) Appl. No.: 15/536,614

(22) PCT Filed: Dec. 9, 2015

(86) PCT No.: PCT/DE2015/100528
§ 371 (c)(1),
(2) Date: Jun. 19, 2017

(87) PCT Pub. No.: WO2016/095900
PCT Pub. Date: Jun. 23, 2016

(65) Prior Publication Data
US 2018/0330975 A1     Nov. 15, 2018

(30) Foreign Application Priority Data

Dec. 18, 2014   (DE) .................. 10 2014 119 090.4

(51) Int. Cl.
*H01L 21/677*   (2006.01)
*H01L 21/67*    (2006.01)
*H01L 21/02*    (2006.01)

(52) U.S. Cl.
CPC .. *H01L 21/67706* (2013.01); *H01L 21/02019* (2013.01); *H01L 21/6704* (2013.01);
(Continued)

(58) Field of Classification Search
None
See application file for complete search history.

(56) References Cited

U.S. PATENT DOCUMENTS

2009/0032492 A1   2/2009   Junze-Concewitz
2012/0037478 A1*  2/2012   Shih ...................... B65G 13/04
                                                       198/780

FOREIGN PATENT DOCUMENTS

DE   10 2007 026 081 A1   11/2008
DE   10 2007 054 089 A1   5/2009
(Continued)

*Primary Examiner* — Karla A Moore
(74) *Attorney, Agent, or Firm* — Christensen, Fonder, Dardi & Herbert PLLC

(57) ABSTRACT

An in-line wet bench device for the wet-chemical treatment of semiconductor wafers, comprising a plurality of conveying rollers, each of which is rotatable about an axis of rotation, for the in-line transport of semiconductor wafers along a conveying direction, wherein the axes of rotation are arranged parallel to one another and perpendicular to the conveying direction, the conveying rollers having a cylindrical conveying section which extends axially along the respective axis of rotation and forms a conveying surface in the shape of a cylindrical sleeve. The conveying surface has at least one smooth region with surface roughnesses of less than 10 μm when viewed in the axial direction and rough regions with surface roughnesses of more than 100 μm axially adjacent to the smooth region.

8 Claims, 1 Drawing Sheet

(52) U.S. Cl.
CPC .. *H01L 21/67028* (2013.01); *H01L 21/67075* (2013.01); *H01L 21/67742* (2013.01)

(56) References Cited

FOREIGN PATENT DOCUMENTS

| | | | |
|---|---|---|---|
| JP | 2006196783 A | * | 7/2006 |
| KR | 1020080084926 | | 8/2008 |
| KR | 10-2011-0058012 A | | 6/2011 |

* cited by examiner

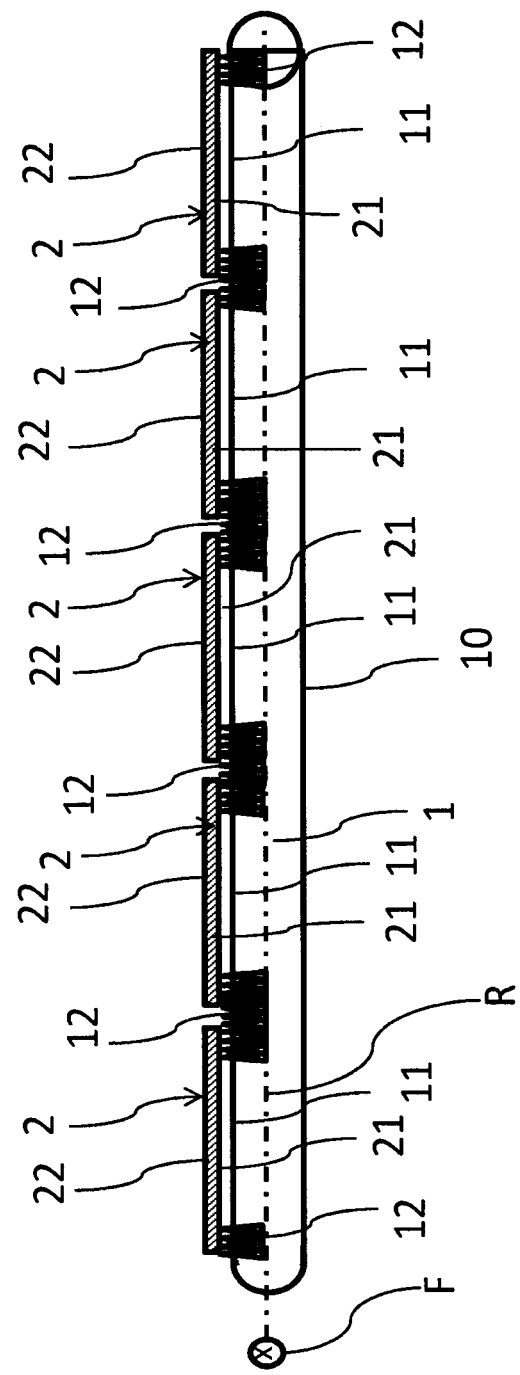

IN-LINE WET BENCH DEVICE AND METHOD FOR THE WET-CHEMICAL TREATMENT OF SEMICONDUCTOR WAFERS

RELATED APPLICATIONS

The present application is a National Phase entry of PCT Application No. PCT/DE2015/100528, filed Dec. 9, 2015, which claims priority to German Patent Application No. 10 2014 119 090.4, filed Dec. 18, 2014, the disclosures of which are hereby incorporated by reference herein in their entirety.

FIELD OF THE INVENTION

The invention relates to an in-line wet bench device for the wet-chemical treatment of semiconductor wafers, and to a method for the wet-chemical treatment of semiconductor wafers.

BACKGROUND OF THE INVENTION

Semiconductor wafers are typically produced from ingots by sawing. Said semiconductor wafers have a front-side surface and a rear-side surface that is opposite the front-side surface, said surfaces being rough from sawing and which have to be treated prior to being further processed to form a semiconductor wafer solar cell, in particular in order for the efficiency of the latter to be maximized. The front-side surface and the rear-side surface of the semiconductor wafer in a semiconductor wafer solar cell ideally have different topographies. While the front-side surface of the semiconductor wafer has a surface enlargement for improved input of light, that is to say has a texture, the rear-side surface should be as smooth as possible, on account of which the barrier layer combination can be reduced in particular in surface-passivated semiconductor wafer solar cells. It is complex for these different surface topographies to be generated in practice.

It is known for semiconductor wafers to be treated with a process solution such as an etching solution, for example an aqueous potassium hydroxide solution, in order for the front-side and/or rear-side surface to be textured. In the case of such texturing, a structure having pyramid-type type protrusions is created on the treated surface by virtue of the intensely anisotropic etching rates of monocrystalline semiconductor materials. The semiconductor wafer during texturing is wet-chemically treated in an in-line wet bench device for the wet-chemical treatment of semiconductor wafers. An in-line wet bench device of this type is known from DE10 2007 026 081 A1, for example. Said in-line wet bench device has a plurality of conveyor rollers for the in-line transportation of semiconductor wafers along a conveying direction, said conveyor rollers in each case being rotatable about a rotation axis, wherein the rotation axes are disposed so as to be mutually parallel and perpendicular to the conveying direction, and the conveyor rollers have a cylindrical conveying portion which extends axially along the respective rotation axis and configures a cylinder-jacket shaped conveying surface. The semiconductor wafers during the wet-chemical treatment are transported on the conveyor rollers and treated with a process solution, for example, by spraying or dipping. Texturing herein can be performed on one side or two sides. However, entirely one-sided texturing is not desirable because the sawing damage that is created during sawing remains in the rear-side surface. For example, when only the front-side surface of the semiconductor wafer is to be entirely textured but the rear side of the semiconductor wafer is only to be textured to the extent required for removing the sawing damage, the semiconductor wafer is transported with the rear-side surface lying on the conveyor rollers and the front-side surface by means of a wetting device which faces the front-side surface of the semiconductor wafers is wetted with a process solution. It can typically not be avoided herein that the process solution also partially wets the conveyor rollers of the in-line wet bench device. In this way, parts of the process solution come into contact with the rear-side surface of the semiconductor wafer, texturing being likewise generated on said rear-side surface. A smooth configuration of the conveyor rollers, that is to say having height deviations in the range of a few micrometers, leads to the rear-side surface of the semiconductor wafer by wetting of the conveyor rollers coming into contact with only minor volumes of the process solution. Therefore, an interaction with the process solution that is lower in comparison to the front-side surface arises here, leading to so-called partial texturing of the wafer rear-side surface. However, a smooth configuration of this type of the conveyor rollers typically also causes rotation of the semiconductor wafers during transportation. This means that transportation that is stable in terms of adhering to the track in the conveying direction is not always a given in the in-line wet bench device.

SUMMARY OF THE INVENTION

It is therefore an object of the invention to provide an in-line wet bench device for the wet-chemical treatment of semiconductor wafers, and a method for the wet-chemical treatment of semiconductor wafers, in which device and method, respectively, rotation-free transportation of the semiconductor wafers that is stable in terms of adhering to the track is guaranteed.

According to the invention, the object is achieved by an in-line wet bench device having the features of patent claim 1, and by a method having the features of patent claim 5.

An in-line wet bench device for the wet-chemical treatment of semiconductor wafers is provided, said in-line wet bench device having a plurality of conveyor rollers for the in-line transportation of semiconductor wafers along a conveying direction, said conveyor rollers being in each case rotatable about a rotation axis, wherein the rotation axes are disposed so as to be mutually parallel and perpendicular to the conveying direction, and the conveyor rollers having a cylindrical conveying portion which extends axially along the respective rotation axis and has a cylinder-jacket shaped conveying surface. It is provided according to the invention that the conveying surface when viewed in the axial direction has at least one smooth region having surface roughness values of less than 10 µm, and axially adjacent to the smooth region has rough regions having surface roughness values of more than 100 µm.

Each smooth region is surrounded by two rough regions, preferably in an axially adjacent manner. Therefore, the conveyor rollers permit that each semiconductor wafer to be transported on the former, by way of the mutually opposite edges of said semiconductor wafer that extend along the conveying direction, can be brought to bear on rough regions for transportation. The surface roughness values chosen permit transportation of the semiconductor wafers on the transportation rollers of the wet bench device such that said semiconductor wafers during transportation bear in each case on the rough regions but do not or only slightly contact the smooth region. On account thereof, rotation-free transportation of the semiconductor wafers on the conveyor rollers can be guaranteed.

The smooth region preferably has surface roughness values of less than 7 μm and more preferably of less than 5 μm. The rough regions preferably have surface roughness values of more than 200 μm, more preferably 250 μm, and particularly preferably of more than 300 μm.

The semiconductor wafers are preferably suitable for the production of solar cells. Said semiconductor wafers are preferably monocrystalline semiconductor wafers such as monocrystalline silicon wafers, for example.

The semiconductor wafers can be of various sizes and shapes. Circular, pseudo-rectangular, and rectangular semiconductor wafers are common. 2-inch to 6-inch, 8-inch, 12-inch, and 18-inch semiconductor wafers which have a diameter of approximately 50 mm to 450 mm are commercially available. An area ratio of the smooth region in relation to the adjacent rough regions is preferably configured in such a manner that two mutually opposite peripheral regions of the semiconductor wafers to be transported on the conveyor rollers bear on the rough regions, and parts of each semiconductor wafer that do not bear on the rough regions is in each case disposed above a smooth region during the transportation of said semiconductor wafer on the conveyor rollers. In one preferred embodiment, the smooth region when viewed in the axial direction of the rotation axis and in relation to the adjacent rough regions has an area ratio of at least 80:20. This area region in relation to a longitudinal dimension of the semiconductor wafer to be transported is preferably at least 90:10. A smooth region which is disposed between two rough regions preferably has an axial extent in the range of 40 mm and 360 mm, and each rough region has an axial extent in the range of 5 mm to 50 mm. With a view to the efficiency of the in-line wet bench device, the conveyor rollers are configured in such a manner that the former when viewed in the axial direction have a plurality of smooth regions, each of the latter having rough regions adjacent thereto on the left and the right. On account thereof, a plurality of semiconductor wafers can be transported and thus processed in parallel by way of one conveyor roller.

The conveyor-roller material at least in the region of the conveying surface preferably comprises plastic. The conveyor rollers preferably have a roller material that is selected from the group composed of polyethylene, polypropylene, ethylene-chlorotrifluoroethylene copolymer, and/or polyvinylidene fluoride. The conveyor rollers can also comprise stainless steel or silica glass.

In one preferred embodiment, the conveying surface by way of the smooth region thereof and by way of the adjacent rough regions is configured from one and the same material so as to be integral. For example, the smooth region and the rough regions form an integral polymer sheathing on a conveyor-roller core cylinder of stainless steel or silica glass.

In one preferred embodiment, the in-line wet bench device has a wetting installation for wetting the semiconductor wafers with a process solution, said wetting installation facing that front-side surface of the semiconductor wafer that faces away from the conveyor rollers. The wetting installation can be a spray device such as a nozzle, or a dipping device such as a dipping bath. The wetting installation is preferably a surge box or a surge pipe. The combination of the smooth region with adjacent rough regions on the conveying surface has the effect of the reliable and directionally stable transportation by way of the rough regions on which peripheral regions of the semiconductor wafers bear during a wet-chemical treatment by means of the wetting installation. When the front-side surface is wet-chemically treated using the wetting installation, a rear-side surface that is only partially textured is created. Partial texturing herein is created in particular in regions of the rear-side surface which during transportation of the semiconductor wafers bear on the conveyor rollers above the smooth regions. The smooth regions are wetted by the process solution which exits from the wetting installation that faces the front-side surface of the semiconductor wafer by way of wetting of the conveyor rollers. This guarantees wetting of the rear-side surface of the semiconductor wafers in the case of conveyor rollers which lie below the wetting device. By virtue of the partial texturing, sawing damage on the rear-side surface of the semiconductor wafer is still removed. Subsequent smoothing of the rear sides of the semiconductor wafers, as is desired in many processes for the treatment of semiconductor wafers, is less complex when the rear side in comparison to the front side is only partially textured. This means that the roughness of the rear side of the semiconductor wafer in comparison to the front side is less.

The invention furthermore relates to a method for the wet-chemical treatment of semiconductor wafers, in which method the semiconductor wafers are transported on conveyor rollers of the aforedescribed in-line wet bench device in one or a plurality of the embodiments described, and are wet-chemically treated during transportation. The in-line wet bench device that is employed in the method has a plurality of conveyor rollers for the in-line transportation of semiconductor wafers along a conveying direction, said conveyor rollers being in each case rotatable about a rotation axis, wherein the rotation axes are disposed so as to be mutually parallel and perpendicular to the conveying direction, and the conveyor rollers having a cylindrical conveying portion which extends axially along the respective rotation axis and has a cylinder-jacket shaped conveying surface, wherein the conveying surface when viewed in the axial direction has at least one smooth region having surface roughness values of less than 10 μm, and axially adjacent to the smooth region has rough regions having surface roughness values of more than 100 μm. On account thereof, rotation-free transportation of the semiconductor wafers on the conveyor rollers can be guaranteed during a wet-chemical treatment.

The semiconductor wafers are preferably transported by way of edge portions of the rear-side surface of the former bearing on the rough regions during the wet-chemical treatment. A process solution is preferably applied to the front-side surface, for example by means of wetting, spraying, dipping of the front-side surface, during transportation. On account thereof, the semiconductor wafer is wet-chemically treated. The rear-side surface herein is wetted only by way of indirect wetting by means of wetting the conveyor rollers by a process solution that is running off. In particular, regions of the rear-side surface of the semiconductor wafers that during transportation are located above smooth regions are textured, but to a significantly lesser extent than the front-side surface. The texturing of the rear-side surface is preferably carried out in such a manner that the sawing damage is removed. The wet-chemical treatment of the semiconductor wafers preferably comprises the removal of sawing damage on the rear-side surface and the texturing of the front-side surface. The semiconductor wafers are preferably transported on the conveyor rollers in such a manner that two mutually opposite peripheral regions of the rear-side surface bear on the rough regions of the conveyor rollers, and all other regions of the semiconductor wafer are transported by way of a smooth region. The semiconductor wafers therefore preferably do not or only slightly contact the smooth region.

In one preferred embodiment, the semiconductor wafer is wet-chemically treated by means of a wetting installation which faces that front-side surface of the semiconductor wafer that faces away from the conveyor rollers. The wetting installation is configured for applying the process solution to the front-side surface of the semiconductor wafers during transportation of the latter on the conveyor rollers. On account thereof, the front-side surface can be wet-chemically treated directly and the rear-side surface of the semiconductor wafers can be wet-chemically treated indirectly with the process solution by means of the wetting installation by way of the conveyor rollers which are disposed in the region of the wetting installation. The wetting installation can have a spray device such as a nozzle or a dipping device such as a dipping tank. The wetting installation is preferably configured as a surge box or as a surge pipe.

The wet-chemical treatment preferably comprises texturing of the semiconductor wafers. Preferably, the front-side surfaces of the semiconductor wafers are fully textured and the rear-side surfaces of the semiconductor wafers are partially textured during transportation on the conveyor rollers in the in-line wet bench device. Partial texturing preferably has the effect of at least removing sawing damage on the semiconductor wafers.

The conveyor rollers that are employed for carrying out the method in each case preferably have one smooth region having surface roughness values of less than 7 μm and preferably less than 5 μm, and rough regions having surface roughness values of more than 200 μm, more preferably 250 μm, and particularly preferably 300 μm. Texturing of the front-side surface and partial texturing of the rear-side surface for example can thus be ensured.

In one preferred embodiment, the smooth region when viewed in the axial direction and in relation to the adjacent rough regions has an area ratio of at least 80:20. This area ratio in relation to a longitudinal dimension of the semiconductor wafer to be transported is more preferably at least 90:10. A smooth region which is disposed between two rough regions preferably has an axial extent in the range of 40 mm and 360 mm, and each rough region has an axial extent in the range of 5 mm to 50 mm. The semiconductor wafers employed in the method can be of various sizes and shapes. Circular, pseudo-rectangular, and rectangular semiconductor wafers are common. 2-inch to 6-inch, 8-inch, 12-inch, and 18-inch semiconductor wafers which have a diameter of approximately 50 mm to 450 mm are commercially available. The area ratio of the smooth region in relation to the adjacent rough regions is configured in such a manner that two mutually opposite peripheral regions of the semiconductor wafers to be transported on the conveyor rollers bear on the rough regions, and parts of each semiconductor wafer that do not bear on the rough regions is in each case disposed above a smooth region during the transportation of said semiconductor wafer on the conveyor rollers. The semiconductor wafers that are employed in the method are preferably suitable for the production of solar cells. Said semiconductor wafers are preferably monocrystalline semiconductor wafers such as monocrystalline silicon wafers, for example.

The conveyor rollers that are employed in the method preferably have a roller material which is selected from the group composed of polyethylene, polypropylene, ethylene-chlorotrifluoroethylene copolymer, and/or polyvinylidene fluoride. The conveyor rollers can also comprise stainless steel or silica glass. These materials are sufficiently resistant to a process solution such as an etching solution, for example a potassium hydroxide solution, that is employed in the wet-chemical treatment of semiconductor wafers, and are thus repeatedly usable in the method.

The conveying surface by way of the smooth region thereof and by way of the adjacent rough regions is preferably configured from one and the same material so as to be integral. For example, the smooth region and the rough regions form an integral polymer sheathing on a conveyor-roller core cylinder of stainless steel or silica glass. The desired surface topography of the conveyor-roller conveying surface can in this way be generated in a particularly simple manner from a conveyor roller having a uniform polymer surface by way of a portion-wise mechanical or laser-optical surface treatment.

Further advantages and properties of the invention will be explained by means of the preferred embodiment hereunder that is described in a purely exemplary manner.

BRIEF DESCRIPTION OF THE DRAWINGS

FIG. 1 shows an axially oriented sectional view of a cylindrical conveyor roller.

DETAILED DESCRIPTION

FIG. 1 shows a sectional view of a cylindrical conveyor roller 1 having an axial rotation axis R, wherein the sectional view is oriented along the axial rotation axis R. The conveyor roller 1 is part of an in-line wet bench device (not shown) which is configured for the wet-chemical treatment of semiconductor wafers 2. The in-line wet bench device has a plurality of conveyor rollers 1 for the in-line transportation of semiconductor wafers 2 along a conveying direction F which extends perpendicularly to the plane of FIG. 1, said conveyor rollers 1 being in each case rotatable about a rotation axis R. The rotation axes R of all conveyor rollers are disposed so as to be mutually parallel and perpendicular to the conveying direction F. Each of the conveyor rollers 1, one of which is shown in the cross section in FIG. 1, has a cylindrical conveying portion which extends axially along the respective rotation axis R and configures a cylinder-jacket shaped conveying surface 10. The conveying surface 10 when viewed in the axial direction has at least one smooth region 11 having surface roughness values of less than 10 μm and, adjacent to the smooth region 11 on either side, rough regions 12 having surface roughness values of more than 100 μm. The rough regions 12 are shown on the conveying surface 10 in a purely schematic manner, not to scale, and only in portions. Each of the rough region 12 and each of the smooth regions 11 is embodied so as to be rotationally symmetrical in relation to the rotation axis R of the conveyor roller, and thus represents an axial portion of the cylinder-jacket shaped conveying surface 10. The number of smooth regions 11 and of semiconductor wafers 2 shown in FIG. 1 has been chosen here so as to be exemplary of the parallel in-line transportation of five semiconductor wafers 2.

For the wet-chemical treatment of the semiconductor wafers 2 in the in-line wet bench device, semiconductor wafers 2 that have been provided are placed on at least one conveyor roller 1 such that in each case two mutually opposite peripheral regions of a rear-side surface 21 of the semiconductor wafers 2 bear on two rough regions 12, having an interdisposed smooth region 11, and all further regions of the rear-side surface are disposed above the smooth region 11. For transportation of the semiconductor wafers 2 in the conveying direction F, the conveyor rollers 1 are set in rotation about the rotation axes R thereof. In order for the semiconductor wafers 2 to be wet-chemically treated, the front-side surface 22 of the semiconductor wafers 2 that is opposite the rear-side surface 21 is treated with a process solution (not shown) from a wetting installation (not shown) such as a surge box by wetting, spraying, dipping, or the like. The process solution herein also wets the conveyor rollers and, on account thereof, also acts on the rear-side surface 21. However, the latter is textured above the smooth region 11 to a significantly lesser extent than the front-side surface 22, such that reference is made to partial texturing.

LIST OF REFERENCE SIGNS

F Conveying direction
R Rotation axis
1 Conveyor roller
10 Conveying surface
11 Smooth region
12 Rough region
2 Semiconductor wafer
21 Rear-side surface
22 Front-side surface

The invention claimed is:

1. A method for wet-chemical treatment of semiconductor wafers, comprising:
   transporting a plurality of semiconductor wafers on a plurality of conveyor rollers along a conveying direction, each of said conveyor rollers being rotatable about a respective rotation axis,
   wherein the rotation axes of the plurality of conveyer rollers are disposed so as to be mutually parallel, and to be perpendicular to the conveying direction, and each of the plurality of conveyor rollers has a cylindrical conveying portion which extends axially along the respective rotation axis and forms a conveyor-roller surface, and
   wherein the conveyor-roller surface of each of the plurality of conveyer rollers includes a plurality of smooth regions distributed axially, each smooth region having a surface roughness value of less than 10 μm, and a plurality of rough regions, each rough region having a surface roughness value of more than 100 μm, wherein the plurality of smooth regions and the plurality of rough regions alternate axially such that each smooth region is between a pair of rough regions, and each of the plurality of rough regions extends radially further than each of the smooth regions, such that each conveyor roller is configured to bear said semiconductor wafers during transportation on the plurality of rough regions,
   processing the semiconductor wafers simultaneously during transport while supporting the semiconductor wafers on adjacent inner rough regions of the plurality of rough regions, wherein the each of the inner rough regions is configured to support two substrates simultaneously for processing.

2. The method of claim 1, wherein each of the smooth regions when viewed in the axial direction of the rotation axis and in relation to the adjacent rough regions has an area ratio of at least 80:20.

3. The method of claim 1, wherein the plurality of conveyor rollers at least in the region of the conveyor-roller surface have a roller material that is selected from the group consisting of polyethylene, polypropylene, ethylene-chlorotrifluoroethylene copolymer, and/or polyvinylidene fluoride.

4. The method of claim 1, wherein the conveyor-roller surface is axially continuous.

5. The method of claim 1, wherein an axial length of each of the plurality of smooth regions is longer than an axial length of each of the plurality of rough regions.

6. The method of claim 5, wherein the axial length of each of the plurality of smooth regions is in a range of 40 mm to 360 mm and the axial length of each of the plurality of rough regions in the a range of 5 mm to 50 mm.

7. The method of claim 5, wherein the axial length of each of the plurality of smooth regions is more than twice the axial length of each of the plurality of rough regions.

8. The method of claim 1, wherein the cylindrical conveying portion comprises an polymer sheathing on a conveyor-roller core, the polymer sheathing comprising the plurality of smooth regions and the plurality of rough regions.

* * * * *